United States Patent
Sun et al.

(10) Patent No.: US 9,171,792 B2
(45) Date of Patent: Oct. 27, 2015

(54) SEMICONDUCTOR DEVICE PACKAGES HAVING A SIDE-BY-SIDE DEVICE ARRANGEMENT AND STACKING FUNCTIONALITY

(75) Inventors: Yu-Ching Sun, Jhongli (TW); Fa-Hao Wu, Pingjhen (TW); Kuang-Hsiung Chen, Taoyuan (TW); Chi-Tsung Chiu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 1165 days.

(21) Appl. No.: 13/037,195

(22) Filed: Feb. 28, 2011

(65) Prior Publication Data

US 2012/0217642 A1    Aug. 30, 2012

(51) Int. Cl.
*H01L 23/48*    (2006.01)
*H01L 23/52*    (2006.01)
(Continued)

(52) U.S. Cl.
CPC ...... *H01L 23/49816* (2013.01); *H01L 23/3128* (2013.01); *H01L 24/73* (2013.01); *H01L 25/105* (2013.01); *H01L 25/16* (2013.01); *H01L 25/50* (2013.01); *H01L 23/552* (2013.01); *H01L 24/48* (2013.01); *H01L 25/0655* (2013.01); *H01L 25/0657* (2013.01); *H01L 2223/6677* (2013.01); *H01L 2224/16225* (2013.01); *H01L 2224/32145* (2013.01); *H01L 2224/32225* (2013.01);
(Continued)

(58) Field of Classification Search
CPC ........... H01L 2924/15311; H01L 2225/06513; H01L 25/0652; H01L 24/81
USPC .......... 257/686, 777, 723, 724, 778
See application file for complete search history.

(56) References Cited

U.S. PATENT DOCUMENTS 5,072,289 A    12/1991    Sugimoto et al.
5,128,831 A    7/1992    Fox, III et al.
(Continued)

FOREIGN PATENT DOCUMENTS

JP    07335783    12/1995
JP    2000294720    10/2000
(Continued)

OTHER PUBLICATIONS

Wang et al., "Coupled power and thermal cycling reliability of board-level package-on-package atacking assembly" IEEE Transactions on Electronics Packaging Manufacturing, 32(1): 14-21, 2009.
(Continued)

*Primary Examiner* — S. V. Clark
(74) *Attorney, Agent, or Firm* — Klein, O'Neill & Singh, LLP (57) ABSTRACT

A semiconductor device package including a substrate, a first device module, a second device module, and an package body. The first device module and the second device module are disposed side-by-side on a carrier surface of the substrate. The first device module includes first connecting elements provided with a first pitch. The second device module includes second connecting elements provided with a second pitch. The first pitch is different from the second pitch. The package body is disposed on the carrier surface and covers the first chip module and the second chip module. The package body includes first openings exposing the first connecting elements and second openings exposing the second connecting elements.

19 Claims, 6 Drawing Sheets

(51) Int. Cl.
  *H01L 23/28* (2006.01)
  *H01L 23/498* (2006.01)
  *H01L 23/31* (2006.01)
  *H01L 25/10* (2006.01)
  *H01L 25/00* (2006.01)
  *H01L 25/16* (2006.01)
  *H01L 23/00* (2006.01)
  *H01L 25/065* (2006.01)
  *H01L 23/552* (2006.01)

(52) U.S. Cl.
  CPC ............... *H01L2224/48227* (2013.01); *H01L 2224/73207* (2013.01); *H01L 2224/73265* (2013.01); *H01L 2225/0651* (2013.01); *H01L 2225/06568* (2013.01); *H01L 2225/1023* (2013.01); *H01L 2225/1052* (2013.01); *H01L 2225/1058* (2013.01); *H01L 2924/014* (2013.01); *H01L 2924/01005* (2013.01); *H01L 2924/01006* (2013.01); *H01L 2924/01074* (2013.01); *H01L 2924/01075* (2013.01); *H01L 2924/15311* (2013.01); *H01L 2924/15331* (2013.01); *H01L 2924/19105* (2013.01); *H01L 2924/3025* (2013.01)

(56) References Cited

U.S. PATENT DOCUMENTS

| | | |
|---|---|---|
| 5,139,610 A | 8/1992 | Dunaway et al. |
| 5,207,585 A | 5/1993 | Byrnes et al. |
| 5,222,014 A | 6/1993 | Lin |
| 5,355,580 A | 10/1994 | Tsukada |
| 5,397,997 A | 3/1995 | Tuckerman et al. |
| 5,400,948 A | 3/1995 | Sajja et al. |
| 5,468,681 A | 11/1995 | Pasch |
| 5,579,207 A | 11/1996 | Hayden et al. |
| 5,594,275 A | 1/1997 | Kwon et al. |
| 5,608,265 A | 3/1997 | Kitano et al. |
| 5,714,800 A | 2/1998 | Thompson |
| 5,726,493 A | 3/1998 | Yamashita et al. |
| 5,748,452 A | 5/1998 | Londa |
| 5,763,939 A | 6/1998 | Yamashita |
| 5,844,315 A | 12/1998 | Melton et al. |
| 5,861,666 A | 1/1999 | Bellaar |
| 5,883,426 A | 3/1999 | Tokuno et al. |
| 5,889,327 A | 3/1999 | Washida et al. |
| 5,889,655 A | 3/1999 | Barrow |
| 5,892,290 A | 4/1999 | Chakravorty et al. |
| 5,929,521 A | 7/1999 | Wark et al. |
| 5,973,393 A | 10/1999 | Chia et al. |
| 5,985,695 A | 11/1999 | Freyman et al. |
| 6,072,236 A | 6/2000 | Akram et al. |
| 6,177,724 B1 | 1/2001 | Sawai |
| 6,194,250 B1 | 2/2001 | Melton et al. |
| 6,195,268 B1 | 2/2001 | Eide |
| 6,303,997 B1 | 10/2001 | Lee |
| 6,448,665 B1 | 9/2002 | Nakazawa et al. |
| 6,451,624 B1 | 9/2002 | Farnworth et al. |
| 6,461,881 B1 | 10/2002 | Farnworth et al. |
| 6,489,676 B2 | 12/2002 | Taniguchi et al. |
| 6,501,165 B1 | 12/2002 | Farnworth et al. |
| 6,513,236 B2 | 2/2003 | Tsukamoto |
| 6,521,995 B1 | 2/2003 | Akram et al. |
| 6,525,413 B1 | 2/2003 | Cloud et al. |
| 6,614,104 B2 | 9/2003 | Farnworth et al. |
| 6,617,687 B2 | 9/2003 | Adram et al. |
| 6,740,546 B2 | 5/2004 | Corisis et al. |
| 6,740,964 B2 | 5/2004 | Sasaki |
| 6,780,746 B2 | 8/2004 | Kinsman et al. |
| 6,787,392 B2 | 9/2004 | Quah |
| 6,798,057 B2 | 9/2004 | Bolkin et al. |
| 6,812,066 B2 | 11/2004 | Taniguchi et al. |
| 6,815,254 B2 | 11/2004 | Mistry et al. |
| 6,828,665 B2 | 12/2004 | Pu et al. |
| 6,847,109 B2 | 1/2005 | Shim |
| 6,861,288 B2 | 3/2005 | Shim et al. |
| 6,888,255 B2 | 5/2005 | Murtuza et al. |
| 6,924,550 B2 | 8/2005 | Corisis et al. |
| 6,936,930 B2 | 8/2005 | Wang |
| 6,974,334 B2 | 12/2005 | Hung |
| 7,002,805 B2 | 2/2006 | Lee |
| 7,015,571 B2 | 3/2006 | Chang et al. |
| 7,026,709 B2 | 4/2006 | Tsai et al. |
| 7,029,953 B2 | 4/2006 | Sasaki |
| 7,034,386 B2 | 4/2006 | Kurita |
| 7,049,692 B2 | 5/2006 | Nishimura et al. |
| 7,061,079 B2 | 6/2006 | Weng et al. |
| 7,071,028 B2 | 7/2006 | Koike et al. |
| 7,129,576 B2 | 10/2006 | Humpston |
| 7,185,426 B2 | 3/2007 | Hiner et al. |
| 7,187,068 B2 | 3/2007 | Suh et al. |
| 7,221,045 B2 | 5/2007 | Park et al. |
| 7,242,081 B1 | 7/2007 | Lee |
| 7,242,099 B2 | 7/2007 | Lin et al. |
| 7,262,080 B2 | 8/2007 | Go et al. |
| 7,279,784 B2 | 10/2007 | Liu |
| 7,279,789 B2 | 10/2007 | Cheng |
| 7,288,835 B2 | 10/2007 | Yim et al. |
| 7,291,929 B2 | 11/2007 | Tanaka et al. |
| 7,309,913 B2 | 12/2007 | Shim et al. |
| 7,345,361 B2 | 3/2008 | Mallik et al. |
| 7,354,800 B2 | 4/2008 | Carson |
| 7,364,945 B2 | 4/2008 | Shim et al. |
| 7,364,948 B2 | 4/2008 | Lai et al. |
| 7,365,427 B2 | 4/2008 | Lu et al. |
| 7,372,141 B2 | 5/2008 | Karnezos et al. |
| 7,372,151 B1 | 5/2008 | Fan et al. |
| 7,394,663 B2 | 7/2008 | Yamashita et al. |
| 7,408,244 B2 | 8/2008 | Lee et al. |
| 7,417,329 B2 | 8/2008 | Chuang et al. |
| 7,429,786 B2 | 9/2008 | Karnezos et al. |
| 7,429,787 B2 | 9/2008 | Karnezos et al. |
| 7,436,055 B2 | 10/2008 | Hu |
| 7,436,074 B2 | 10/2008 | Pan et al. |
| 7,473,629 B2 | 1/2009 | Tai et al. |
| 7,485,970 B2 | 2/2009 | Hsu et al. |
| 7,550,832 B2 | 6/2009 | Weng et al. |
| 7,550,836 B2 | 6/2009 | Chou et al. |
| 7,560,818 B2 | 7/2009 | Tsai |
| 7,586,184 B2 | 9/2009 | Hung et al. |
| 7,589,408 B2 | 9/2009 | Weng et al. |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,719,094 B2 | 5/2010 | Wu et al. |
| 7,723,839 B2 | 5/2010 | Yano et al. |
| 7,728,431 B2 | 6/2010 | Harada et al. |
| 7,737,539 B2 | 6/2010 | Kwon et al. |
| 7,737,565 B2 | 6/2010 | Coffy |
| 7,750,455 B2 | 7/2010 | Pagaila et al. |
| 7,777,351 B1 | 8/2010 | Berry et al. |
| 7,807,512 B2 | 10/2010 | Lee et al. |
| 7,834,464 B2 | 11/2010 | Meyer et al. |
| 7,838,334 B2 | 11/2010 | Yu et al. |
| 8,039,303 B2 | 10/2011 | Shim et al. |
| 2003/0090883 A1 | 5/2003 | Asahi et al. |
| 2003/0129272 A1 | 7/2003 | Shen et al. |
| 2004/0106232 A1 | 6/2004 | Sakuyama et al. |
| 2004/0124515 A1 | 7/2004 | Tao et al. |
| 2004/0191955 A1 | 9/2004 | Joshi et al. |
| 2005/0029644 A1 | 2/2005 | Ho et al. |
| 2005/0054187 A1 | 3/2005 | Ding et al. |
| 2005/0117835 A1 | 6/2005 | Nguyen et al. |
| 2005/0121764 A1 | 6/2005 | Mallik |
| 2006/0035409 A1 | 2/2006 | Suh et al. |
| 2006/0220210 A1 | 10/2006 | Karnezos et al. |
| 2006/0240595 A1 | 10/2006 | Lee |
| 2006/0244117 A1 | 11/2006 | Karnezos et al. |
| 2007/0029668 A1 | 2/2007 | Lin et al. |
| 2007/0090508 A1 | 4/2007 | Lin et al. |
| 2007/0108583 A1 | 5/2007 | Shim et al. |
| 2007/0241453 A1 | 10/2007 | Ha et al. |
| 2007/0273049 A1 | 11/2007 | Khan et al. |

(56) References Cited

U.S. PATENT DOCUMENTS

| | | |
|---|---|---|
| 2007/0290376 A1 | 12/2007 | Zhao et al. |
| 2008/0017968 A1* | 1/2008 | Choi et al. ............ 257/686 |
| 2008/0073769 A1 | 3/2008 | Wu et al. |
| 2008/0116574 A1 | 5/2008 | Fan |
| 2008/0136004 A1* | 6/2008 | Yang et al. ............ 257/686 |
| 2008/0157328 A1* | 7/2008 | Kawata ............ 257/686 |
| 2008/0230887 A1 | 9/2008 | Sun et al. |
| 2009/0101400 A1 | 4/2009 | Yamakoshi |
| 2009/0127686 A1 | 5/2009 | Yang et al. |
| 2010/0000775 A1 | 1/2010 | Shen et al. |
| 2010/0072600 A1* | 3/2010 | Gerber ............ 257/686 |
| 2010/0171205 A1 | 7/2010 | Chen et al. |
| 2010/0171206 A1 | 7/2010 | Chu et al. |
| 2010/0171207 A1* | 7/2010 | Shen et al. ............ 257/686 |
| 2010/0214780 A1 | 8/2010 | Villard |
| 2010/0244208 A1 | 9/2010 | Pagaila et al. |
| 2010/0320585 A1 | 12/2010 | Jiang et al. |
| 2011/0049704 A1 | 3/2011 | Sun et al. |
| 2011/0062574 A1* | 3/2011 | Jang et al. ............ 257/686 |
| 2011/0068453 A1 | 3/2011 | Cho et al. |
| 2011/0117700 A1 | 5/2011 | Weng et al. |
| 2011/0140364 A1 | 6/2011 | Head |
| 2011/0156251 A1 | 6/2011 | Chu et al. |
| 2011/0241192 A1 | 10/2011 | Ding et al. |
| 2011/0241193 A1 | 10/2011 | Ding et al. |
| 2011/0278741 A1 | 11/2011 | Chua et al. |
| 2013/0270685 A1* | 10/2013 | Yim et al. ............ 257/686 |

FOREIGN PATENT DOCUMENTS

| | | |
|---|---|---|
| JP | 2001298115 | 10/2001 |
| JP | 2002158312 | 5/2002 |
| JP | 2002170906 | 6/2002 |
| JP | 2004327855 | 11/2004 |
| JP | 2009054686 | 3/2009 |
| KR | 2002043435 | 6/2002 |
| KR | 2003001963 | 1/2010 |
| TW | 0529155 | 4/2003 |
| TW | 1229927 | 3/2005 |
| TW | 200611305 | 1/2006 |

OTHER PUBLICATIONS

Lai et al., "Optimization of thermomechanical reliability of board-level package-on-package stacking assembly" IEEE Transactions on Components and Packaging Technologies, 29(4): 864-868, 2006.

Wang et al., "Board-level reliability of package-on-package stacking assemblies subjected to coupled power and thermal cycling tests" 9th Electronics Packaging Technology Conference, 2007.

Yoshida et al., "A Study on Package Stacking Process for Package-on-Package (PoP)"; Electronic Components and Tech. Conf. (ECTC), May 2006, San Diego, CA.

Dreiza et al., "High Density PoP (Package-on-Package) and Package Stacking Development"; Electronic Components and Technology Conference, 2007.

\* cited by examiner

SEMICONDUCTOR DEVICE PACKAGES HAVING A SIDE-BY-SIDE DEVICE ARRANGEMENT AND STACKING FUNCTIONALITY

TECHNICAL FIELD

The present embodiments relate to semiconductor device packaging and related processes.

BACKGROUND

Electronic products have become progressively more complex, driven at least in part by the demand for enhanced functionality and smaller sizes. While the benefits of enhanced functionality and smaller sizes are apparent, achieving these benefits presents challenges. In particular, portable electronic products typically have to accommodate a high density of semiconductor devices in a limited space. For example, available space for processors, memory devices, and other active or passive devices is limited in portable electronic products such as cell phones, personal digital assistants, laptop computers, etc. Further, semiconductor devices are typically packaged so as to provide protection against environmental conditions, as well as to provide a desired amount of electrical input and output (I/O) connections. Packaging containing semiconductor devices can also occupy additional valuable space within electronic products. As a result, efforts are being made to reduce the footprint made by semiconductor device packages. One approach is to stack semiconductor device packages on top of one another to form a stacked package assembly. Such package assemblies are sometimes referred to as package-on-package ("PoP") assemblies. Continuous efforts are being made to improve PoP assemblies.

SUMMARY

One aspect of the present embodiments is the realization that it would be desirable to develop semiconductor device packages and related processes that are capable of effectively integrating a plurality of device modules with different lead layouts in a way that increases compatibility with other packages.

One of the present embodiments comprises a substrate including a top surface, a first die coupled to the top surface of the substrate, and a second die coupled to the top surface of the substrate. A plurality of first connecting elements are coupled to the top surface of the substrate. The embodiment further comprises a plurality of second connecting elements, and a package body covering the first die and the second die. A plurality of first openings in the package body expose the first connecting elements, and a plurality of second openings in the package body expose the second connecting elements. The first connecting elements are spaced by a first pitch $P_1$, the second connecting elements are spaced by a second pitch $P_2$, and the first pitch $P_1$ is not equal to the second pitch $P_2$.

Another of the present embodiments comprises a substrate including a top surface, a die coupled to the top surface of the substrate, a plurality of first connecting elements coupled to the top surface of the substrate, and a plurality of second connecting elements coupled to the top surface of the substrate. A package body covers the die. A plurality of first openings in the package body expose the first connecting elements, and a plurality of second openings in the package body expose the second connecting elements. The first connecting elements are spaced by a first pitch $P_1$, the second connecting elements are spaced by a second pitch $P_2$, and the first pitch $P_1$ is not equal to the second pitch $P_2$.

Another of the present embodiments comprises a manufacturing process. The process comprises coupling a first chip and a second chip to a substrate, coupling a plurality of first connecting elements to the substrate, and coupling a plurality of second connecting elements to the substrate. The first connecting elements are spaced by a first pitch $P_1$, and the second connecting elements are spaced by a second pitch $P_2$, and the first pitch $P_1$ is not equal to the second pitch $P_2$. The process further comprises disposing a package body on or adjacent to the substrate to cover the first chip, the first connecting elements, the second chip, and the second connecting elements. The process further comprises forming a plurality of first openings and a plurality of second openings in the package body, wherein the first openings expose the first connecting elements, and the second openings expose the second connecting elements.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1A:
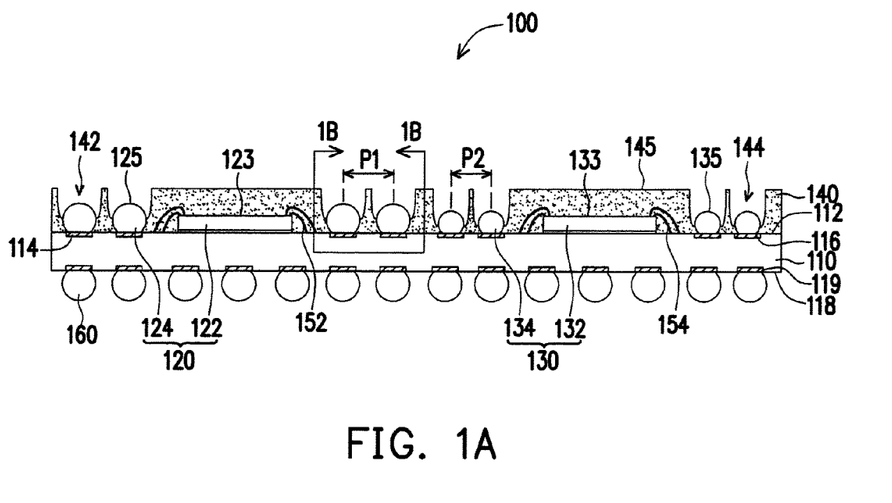
FIG. 1A is a cross-sectional front elevation view of a semiconductor device package according to one of the present embodiments.

Referring to FIG. 1A, a cross-sectional view of a semiconductor device package 100 according to one of the present embodiments is illustrated. The semiconductor device package 100 includes a substrate 110, a first device module 120, a second device module 130, and an encapsulant or package body 140. In the illustrated embodiment, the lead designs of the first device module 120 and the second device module 130 are fan-out configurations, but could be any configuration, such as a fan-in configuration. In a fan-out configuration, the electrical contacts are distributed in one or more rows and located in a peripheral portion of an upper surface 123, 133 of each device module 120, 130. In a fan-in configuration, the electrical contacts are distributed in an array and located in a central portion of the upper surface 123, 133 of each device module 120, 130. A fan-in configuration advantageously supports a large number of interconnections between stacked packages, and can allow flexibility in accommodating chips of varying designs.

The substrate 110, in all embodiments described herein, may be an organic material, such as polyimide tape, fiberglass reinforced bismaleimide-triazine (BT) resin, FR-4 fiberglass reinforced BT epoxy resin, Ajinomoto Build-Up Film (ABF), or other dielectric materials. The substrate 110 includes a top surface or carrier surface 112, a set of first pads 114 on the carrier surface 112, and a set of second pads 116 on the carrier surface 112. The pads 114, 116, in all embodiments described herein, may be formed from a metal, a metal alloy, or another suitable electrically conductive material, which may be plated onto the substrate 110.

A first pitch between two adjacent ones (e.g., nearest neighbor ones) of the first pads 114 is labeled $P_1$. A second pitch between two adjacent ones (e.g., nearest neighbor ones) of the second pads 116 is labeled $P_2$. The first pitch $P_1$ is greater than the second pitch $P_2$. In certain embodiments, the first pitch $P_1$ can be at least about 1.1 times greater than the second pitch $P_2$, such as at least about 1.2 times greater or at least about 1.5 times greater. The first pitch $P_1$ may be any length, such as in the range of about 300 µm to about 800 µm, such as from about 350 µm to about 650 µm or from about 400 µm to about 600 µm. In certain alternative embodiments the first pitch $P_1$ can be less than, or substantially equal to, the second pitch $P_2$.

The first device module 120 includes a first semiconductor device 122 and a set of first connecting elements 124. The first semiconductor device 122 may be a chip or any other active or passive device. The first connecting elements 124 may be solder balls or other electrically conductive bumps. The first device 122 is coupled to the carrier surface 112 and electrically coupled thereto. The first pads 114 are located on or adjacent to the carrier surface 112 and adjacent to a periphery of the first device 122. In the illustrated embodiment the first pads 114 form two rows surrounding the periphery of the first device 122. The first connecting elements 124 are disposed on the first pads 114, and therefore also form two rows surrounding the periphery of the first device 122.

In the illustrated embodiment, the first device 122 is electrically coupled to the substrate 110 through a set of wires 152 by wire bonding. The first device 122 is further electrically coupled to the first pads 114 through an internal circuit (not shown) of the substrate 110. In alternative embodiments, the first device 122 can be electrically coupled to the substrate 110 by a flip-chip interconnect technology/process or another suitable technology/process. The first connecting elements 124 disposed on the first pads 114 serve as first external contacts. Because the first connecting elements 124 are disposed on the first pads 114, they share the first pitch $P_1$ between two adjacent ones (e.g., nearest neighbor ones) of the first connecting elements 124. While the single device 122 is shown within the first device module 120, multiple devices can be included, such as in a stacked manner or a side-by-side manner.

With continued reference to FIG. 1A, the second device module 130 includes a second semiconductor device 132 and a set of second connecting elements 134. The second semiconductor device 132 may be a chip or any other active or passive device. The second connecting elements 134 may be solder balls or other electrically conductive bumps. The second device 132 is coupled to the carrier surface 112 and electrically coupled thereto. The second pads 116 are located on or the carrier surface 112 and adjacent to a periphery of the second device 132. In the illustrated embodiment the second pads 116 form two rows surrounding the periphery of the second device 132. The second connecting elements 134 are disposed on the second pads 116, and therefore also form two rows surrounding the periphery of the second device 132.

In the illustrated embodiment, the second device 132 is electrically coupled to the substrate 110 through a set of wires 154 by wire bonding. The second device 132 is further electrically coupled to the second pads 116 through the internal circuit (not shown) of the substrate 110. In alternative embodiments, the second device 132 can be electrically coupled to the substrate 110 by a flip-chip interconnect technology/process or any other suitable technology/process. The second connecting elements 134 disposed on the second pads 116 serve as second external contacts. Because the second connecting elements 134 are disposed on the second pads 116, they share the second pitch $P_2$ between two adjacent ones (e.g., nearest neighbor ones) of the second connecting elements 134. While the single device 132 is shown within the second device module 130, multiple devices can be included, such as in a stacked manner or a side-by-side manner. Also, while the two modules 120 and 130 are shown within the package 100, only one module may be included, or additional modules may be included, such as in the form of a 2-by-2 array, a 3-by-3 array, or an n-by-m array, where n≥1, and m≥1.

In addition to the first pitch $P_1$ being different from the second pitch $P_2$, in certain embodiments the size of each first connecting element 124 may be different from the size of each second connecting elements 134, as shown in FIG. 1A. Alternatively, the first connecting elements 124 could have the same size as the second connecting elements 134.

The package body 140 is coupled to the carrier surface 112 and, covers the first device 122 and the second device 132. In addition, the package body 140 includes, or is formed with, a set of first openings 142 and a set of second openings 144 that expose the first connecting elements 124 and the second connecting elements 134, respectively. In the illustrated embodiment, top ends 125 of the first connecting elements 124 and top ends 135 of the second connecting elements 134 are recessed below a top surface 145 of the package body 140. In alternative embodiments the top ends may be substantially aligned or coplanar with the top surface 145, or can protrude above the top surface 145.

In the embodiment of FIG. 1A, the substrate 110 further includes a bottom surface 118, opposite the carrier surface 112. A set of third pads 119 is coupled to the bottom surface 118. Third connecting elements 160, such as solder balls or other electrically conductive bump, are disposed on each of the third pads 119 to allow the package 100 to be connected to an external circuit, such as a printed circuit board (not shown).

Figure 1B:
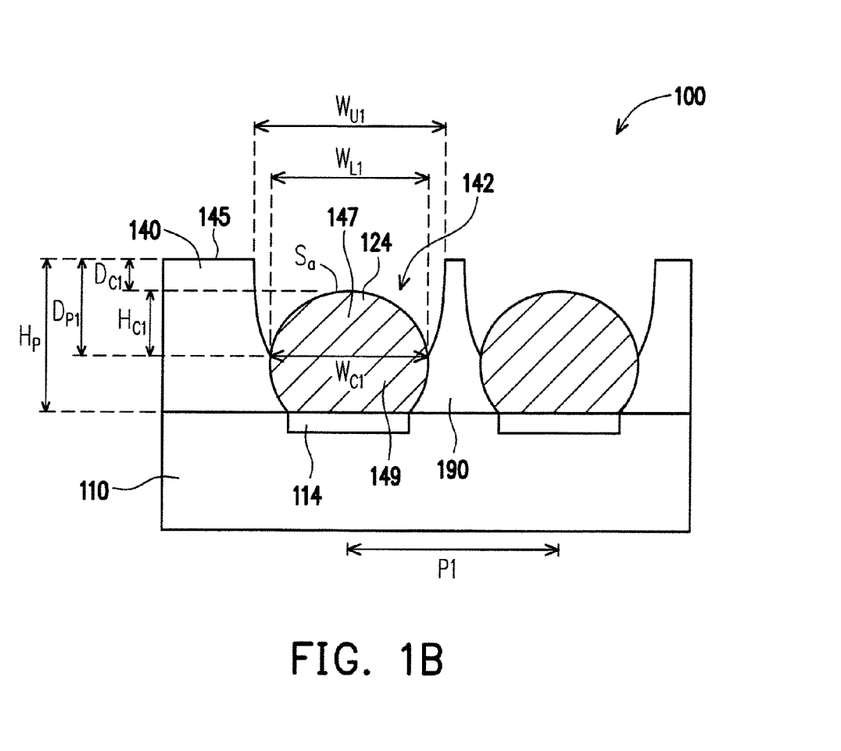
FIG. 1B is a detail view of the portion of FIG. 1A indicated by the box 1B-1B.

FIG. 1B illustrates an enlarged detail view of the portion of the package 100 indicated by the box 1B-1B in FIG. 1A. In particular, FIG. 1B illustrates a particular implementation of the package body 140 and the first connecting elements 124, while certain other details of the package 100 are omitted for clarity.

As illustrated in FIG. 1B, the package body 140 is formed with the first openings 142 that are sized to expose connection surfaces $S_a$ of the first connecting elements 124. In the illustrated embodiment, a size of each first opening 142 can be specified in accordance with a width and a depth of the first opening 142. A number of advantages can be achieved by suitable selection and control over shapes and sizes of the first openings 142, shapes and sizes of the first connecting elements 124, or a combination of these characteristics. In particular, by exposing the connection surfaces $S_a$, the first connecting elements 124, in effect, can serve as a pre-solder for improved adherence and wetting with respect to connecting elements of an external device when stacking that device on top of the package 100. Also, the relatively large areas of the connection surfaces $S_a$ can enhance reliability and efficiency of electrical connections, thereby improving stacking yields. During stacking operations, the package body 140 can have a tendency to expand towards and apply stresses onto the first connecting elements 124, and, if not sufficiently relieved, these expansion stresses can push portions of the first connecting elements 124, in a molten form, in a generally vertical direction and away from the first pads 114. Suitably sizing the first openings 142 to expose the connection surfaces $S_a$ can yield a reduction in contact areas between the first connecting elements 124 and the package body 140, thereby relieving expansion stresses that can otherwise lead to connection failure. Moreover, the first openings 142 can accommodate connecting elements of an external device and can avoid or reduce instances of overflow of a conductive material during stacking operations, thereby allowing stacking to be performed with a reduced pitch.

In the illustrated embodiment, each first opening 142 is shaped in the form of a circular bowl, including a substantially circular cross-section with a variably tapering width. In particular, a lateral boundary of each first opening 142 tapers towards a respective first connecting element 124, and contacts the first connecting element 124 to define a boundary between an uncovered, upper portion 147 of the first connecting element 124 and a covered, lower portion 149 of the first connecting element 124. The rate of taper of each first opening 142 varies in the vertical direction.

In alternative embodiments the shape of each opening 142 can be any shape. For example, an opening can have another type of tapered shape, such as an elliptical cone shape, a square cone shape, or a rectangular cone shape, a non-tapered shape, such as a circular cylindrical shape, an elliptic cylindrical shape, a square cylindrical shape, or a rectangular cylindrical shape, or another regular or irregular shape. It is also contemplated that a lateral boundary of an opening can be curved in a convex fashion, curved in a concave fashion, or roughly textured.

For certain embodiments, an upper width $W_{U1}$ of each first opening 142, namely a diameter or other lateral extent adjacent to a top end of the first opening 142 and adjacent to the top surface 145 of the package body 140, can be in the range of about 250 μm to about 650 μm, such as from about 300 μm to about 600 μm or from about 350 μm to about 550 μm. Further, a lower width $W_{L1}$ of each first opening 142, namely a diameter or other lateral extent adjacent to a bottom end of the first opening 142 and adjacent to the boundary between covered and uncovered portions of a respective first connecting element 124, can be in the range of about 90 μm to about 500 μm, such as from about 135 μm to about 450 μm or from about 180 μm to about 400 μm.

If the first opening 142 has a non-uniform cross-sectional shape, the upper width $W_{U1}$ or the lower width $W_{L1}$ can correspond to, for example, a diameter of a smallest, bounding circle for the non-uniform cross-sectional shape. Also, the upper width $W_{U1}$ of each first opening 142 can be greater than the lower width $W_{L1}$ of the first opening 142, with a ratio of the upper width $W_{U1}$ and the lower width $W_{L1}$ corresponding to an extent of tapering and represented as follows: $W_{U1}=aW_{L1}$, where a is in the range of about 1.1 to about 1.7, such as from about 1.2 to about 1.6 or from about 1.3 to about 1.5. Alternatively, or in conjunction, the upper width $W_{U1}$ and the lower width $W_{L1}$ can be represented relative to a width $W_{C1}$ of a respective first connecting element 124 as follows: $W_{U1}>W_{C1}$ and $W_{C1} \geq W_{L1} \geq bW_{C1}$, where b sets a lower bound for the lower width $W_{L1}$, and can be, for example, about 0.8, about 0.85, or about 0.9, and $W_{C1}$ corresponds to a diameter or other lateral extent of the first connecting element 124. For certain embodiments, an upper bound for the upper width $W_{U1}$ can be represented as follows: $P_1 \geq W_{U1} > W_{C1}$. By setting the upper bound for the upper width $W_{U1}$ in such fashion, the first openings 142 can be sufficiently sized, while retaining a lateral wall 190 that is disposed between the first connecting elements 124. The lateral wall 190 can serve as a barrier to avoid or reduce instances of overflow of an electrically conductive material during stacking operations, thereby allowing stacking elements to have a reduced pitch.

With further reference to FIG. 1B, each first connecting element 124 is sized relative to a thickness $H_P$ of the package body 140, such that the top end of the first connecting element 124 is recessed below the top surface 145 of the package body 140. Thus, a height $H_{C1}$ of each first connecting element 124 is less than the thickness $H_P$ of the package body 140. Each first opening 142 has a depth that varies along a lateral direction or along a radial direction relative to a center of the first opening 142. In particular, a central depth $D_{C1}$ of each first opening 142, namely a vertical distance between the top surface 145 of the package body 140 and the top end of a respective first connecting element 124, corresponds to a minimum depth of the first opening 142. A peripheral depth $D_{P1}$ adjacent to a bottom end of each first opening 142, namely a vertical distance between the top surface 145 of the package body 140 and a boundary between covered and uncovered portions of a respective first connecting element 124, corresponds to a maximum depth of the first opening 142. For certain embodiments, the central depth $D_{C1}$ of each first opening 142 can be in the range of about 20 μm to about 400 μm, such as from about 20 μm to about 180 μm, from about 50 μm to about 150 μm, or from about 80 μm to about 120 μm. Further, the peripheral depth $D_{P1}$ of each first opening 142 can be in the range of about 100 μm to about 500 μm, such as from about 150 μm to about 450 μm or from about 200 μm to about 400 μm. More particularly, the peripheral depth $D_{P1}$ of each first opening 142 can be greater than the central depth $D_{C1}$ of the first opening 142, with a ratio of the peripheral depth $D_{P1}$ and the central depth $D_{C1}$ represented as follows: $D_{P1}=cD_{C1}$, where $c \geq 1.5$ and can be in the range of about 1.5 to about 4.5, such as from about 2 to about 4 or from about 2.5 to about 3.5. Alternatively, or in conjunction, the peripheral depth $D_{P1}$ can be represented relative to the thickness $H_P$ of the package body 140 and the width $W_{C1}$ of a respective first connecting element 124 as follows: $H_P \geq D_{P1} \geq dW_{C1}$, where d sets a lower bound for the peripheral depth $D_{P1}$, and can be, for example, about 0.4, about 0.45, or about 0.5.

Although the above discussion is with reference to the first connecting elements 124 and the first openings 142, the second connecting elements 134 and the second openings 144 can be similarly implemented. For example, a ratio of an upper width $W_{U2}$ and a lower width $W_{L2}$ of each second opening 144 can be represented as follows: $W_{U2}=aW_{L2}$, and the upper width $W_{U2}$ and the lower width $W_{U}$ also can be represented relative to a width $W_{C2}$ of a respective second connecting element 134 as follows: $W_{U2}>W_{c2}$ and $W_{C2} \geq W_{L2} \geq bW_{C2}$. For certain embodiments, an upper bound for the upper width $W_{U2}$ can be represented as follows: $P2 \geq W_{U2}>W_{C2}$. As another example, a ratio of a peripheral depth $D_{P2}$ and a central depth $D_{C2}$ of each second opening 144 can be represented as follows: $D_{P2}=cD_{C2}$, and the peripheral depth $D_{P2}$ also can be represented relative to the thickness $H_P$ of the package body 140 and the width $W_{C2}$ of a respective second connecting element 134 as follows: $H_P \geq D_{P2} \geq dW_{C2}$.

Figure 2:
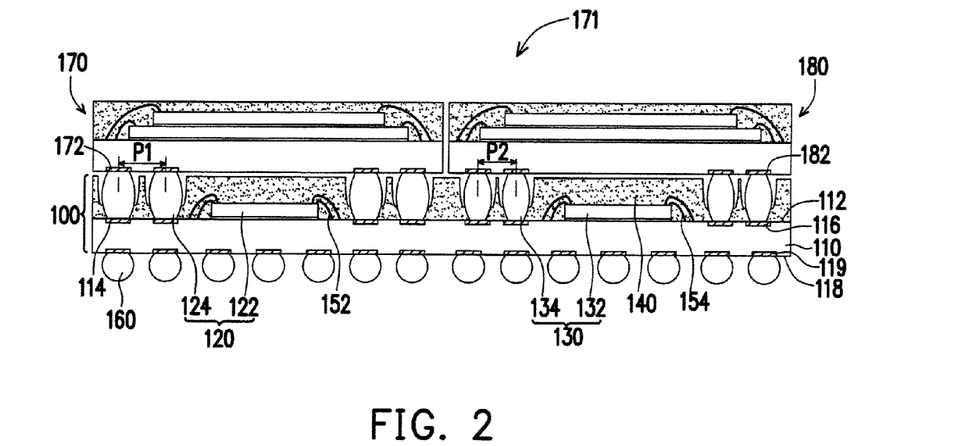
FIG. 2 is a cross-sectional front elevation view of a PoP assembly including the package of FIG. 1A.

FIG. 2 illustrates a PoP assembly 171 obtained by performing a PoP process on the package 100 of FIG. 1A. A first external device 170 and a second external device 180 are disposed over the first device 122 and the second device 132, respectively. Here, the first external device 170 and the second external device 180 can be, for example, semiconductor device packages of a stacked chip type. In certain embodiments, at least one of the first external device 170 and the second external device 180 can be, for example, a chip, such as an unpackaged chip.

The first external device 170 includes a set of first pads 172 having a pitch corresponding to the first pitch $P_1$. The first external device 170 is connected to the first connecting elements 124 of the package 100 through the first pads 172 and, optionally, connecting elements disposed on the first pads 172. The optional connecting elements may comprise, for example, solder balls or other electrically conductive bumps.

The second external device 180 includes a set of second pads 182 having a pitch corresponding to the second pitch $P_2$. The second external device 180 is connected to the second connecting elements 134 through the second pads 182 and, optionally, connecting elements disposed on the second pads 182. The optional connecting elements may comprise, for example, solder balls or other electrically conductive bumps.

Advantageously, in the embodiment illustrated in FIGS. 1A, 1B and 2, the first external device 170 and the second external device 180, which have different lead layouts, including different pitches, can both be stacked on the package 100 in a side-by-side manner. Thus, the present packages enable enhanced compatibility with, and a better ability to accommodate, different types of external devices having different lead layouts and/or different pitches.

In one embodiment of a process for manufacturing the package structures illustrated FIGS. 1A, 1B and 2, the first pads 114 and the second pads 116 are formed on or deposited on the carrier surface 112 of the substrate 110. The first connecting elements 124 and the second connecting elements 134 are then formed on or deposited on the first pads 114 and the second pads 116, respectively, as the first external contacts and the second external contacts, respectively.

Thereafter, the first device 122 and the second device 132 are positioned side-by-side on the carrier surface 112 and connected to the substrate 110 by wire bonding or any other interconnect technology/process. The first pads 114 are located adjacent to the periphery of the first device 122 and electrically coupled to the first device 122 via the bond wires 152. The second pads 116 are located adjacent to the periphery of the second device 132 and electrically coupled to the second device 132 via the bond wires 154.

In the present embodiment, the first connecting elements 124 and the second connecting elements 134 are described as being formed prior to positioning the first device 122 and the second device 132 on the carrier surface 112. However, in alternative embodiments the order of these steps could be reversed, or the steps could be combined.

The process proceeds with forming the package body 140 on the carrier surface 112. At least initially, the package body 140 covers the first device 122, the second device 132, the first connecting elements 124, and the second connecting elements 134. Thereafter, the first openings 142 and the second openings 144 are formed in the package body 140 to expose the first connecting elements 124 and the second connecting elements 134.

In any of the present embodiments, the first openings 142 and the second openings 144 may be formed by laser ablation or any other method, such as mechanical drilling, chemical etching, plasma etching, etc. If the process is laser ablation, the laser may be of any type, such as a green laser, an infrared laser, a solid-state laser, a $CO_2$ laser, etc. The laser can be, for example, a pulsed laser, a continuous wave laser, or any other type. Suitable selection and control over operating parameters of the laser allow control over sizes and shapes of the first and second openings 142, 144. For certain embodiments, a peak output wavelength of the laser can be selected in accordance with a particular composition of the package body 140. For some embodiments, the peak output wavelength can be in the visible range or the infrared range. Also, an operating power of the laser can be in the range of about 3 W to about 20 W, such as from about 3 W to about 15 W or from about 3 W to about 10 W. In the case of a pulsed laser implementation, a pulse frequency and a pulse duration are additional examples of operating parameters that can be suitably selected and controlled.

After the first and second openings 142, 144 are formed, the first external device 170 is positioned over the first device 122 and the second external device 180 is positioned over the second device 132 to create the PoP assembly shown in FIG. 2. The first external device 170 is electrically coupled to the first device 122 via the first connecting elements 124. The second external device 180 is electrically coupled to the second device 132 via the second connecting elements 134. In one embodiment, the first and second external devices 170, 180 could be ball grid array (BGA) packages. In such an embodiment, the bottom balls of the first and second external devices 170, 180 could stack onto the first and second connecting elements 124, 134, respectively, thereby forming stacking elements extending through the first and second openings 142, 144, respectively, and electrically connecting the top package (the first external device 170 and the second external device 180) and the bottom semiconductor device package 100.

At any of various points during the foregoing process, the third connecting elements 160 are formed on or deposited on the third pads 119 on the bottom surface 118 of the substrate 110. For example, this step can be performed before or after the package body 140 is formed. If before, it can be performed before, after, or at the same time as the first and second connecting elements 124, 134 are formed on or deposited on the first and second pads 114, 116 on the carrier surface 112. In fact, the order of operations described with respect to any of the present embodiments should not be interpreted as limiting. Any order of operations is within the scope of the present embodiments.

The processes for forming any of the present embodiments can be performed by using a substrate unit obtained by cutting or singulating an array substrate. Alternatively, the processes for forming any of the present embodiments can be performed on an uncut array substrate. Thus, with respect to the above described operations, after the steps are performed the array substrate may be cut or singulated to obtain one or more of the package structures shown in FIG. 1A or in FIG. 2.

Figure 3:
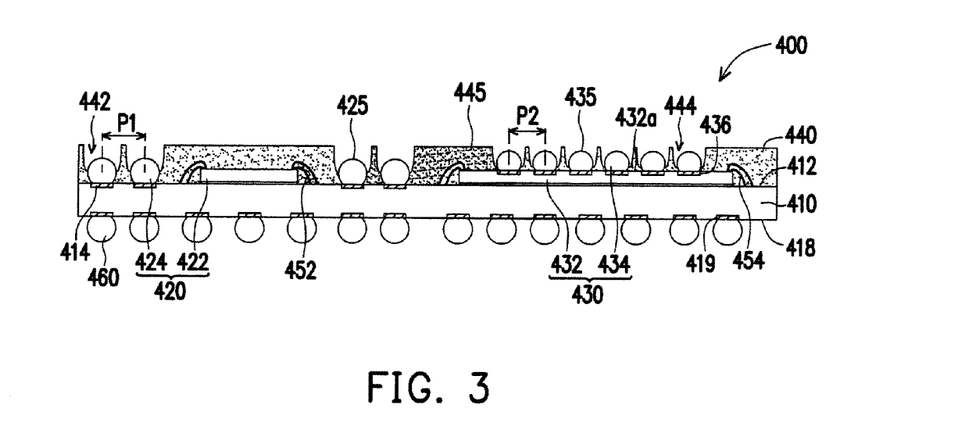
FIG. 3 is a cross-sectional front elevation view of a semiconductor device package according to another one of the present embodiments.

FIG. 3 illustrates a semiconductor device package 400 according to another of the present embodiments. Certain aspects of the package 400 are similar to aspects of the package 100 described above with reference to FIG. 1A. For clarity, these aspects are not repeated below.

With reference to FIG. 3, the package 400 includes a substrate 410, a first device module 420, a second device module 430, and a package body 440. In this embodiment, a lead design of the first device module 420 is a fan-out configuration, while a lead design of the second device module 430 is a fan-in configuration, but either device module could have any configuration. The substrate 410 includes a top surface or carrier surface 412. A set of first pads 414 is located on the carrier surface 412. Two adjacent ones of the first pads 414 are spaced by a first pitch $P_1$.

The first device module 420 includes a first semiconductor device 422 and a set of first connecting elements 424. The first device 422 is located on the carrier surface 412, and the first pads 414 are located adjacent to a periphery of the first device 422. The first connecting elements 424 are disposed on the first pads 414. Two adjacent ones of the first connecting elements 424 are spaced by the first pitch $P_1$. In this embodiment, the first device 422 is electrically coupled to the substrate 410 through a set of wires 452 by wire bonding, and further electrically coupled to the first pads 414 through an internal circuit (not shown) of the substrate 410. In other embodiments, the first device 422 can be electrically coupled to the substrate 410 by a flip-chip interconnect technology/process or any other suitable technology/process.

The second device module 430 includes a second semiconductor device 432 and a set of second connecting elements 434. The second device 432 is located on the carrier surface 412, and includes a set of second pads 436 in the form of an array located on a top surface 432a of the second device 432. The second connecting elements 434 are disposed on the second pads 436. Two adjacent ones of the second pads 436 are spaced by a second pitch $P_2$. Similarly, two adjacent ones of the second connecting elements 434 are spaced by the second pitch $P_2$. The first pitch $P_1$ is greater than the second pitch $P_2$. In alternative embodiments the first pitch $P_1$ can be smaller than, or substantially the same as, the second pitch $P_2$.

In the embodiment of FIG. 3, the second device 432 is electrically coupled to the substrate 410 through a set of wires 454 by wire bonding. The second connecting elements 434 may be electrically coupled to the substrate 410 through a redistribution layer (not shown) on the top surface 432a of the semiconductor device 432 and wires 454. Alternatively, the second device 432 can be electrically coupled to the substrate 410 by a flip-chip interconnect process combined with a through silicon via process (TSV) to electrically connect to a bottom surface 418 of the substrate 410, or any other suitable technology/process. In certain embodiments an interposer (not shown) can be located on the top surface 432a of the second device 432, and the second pads 436 can be located on a top surface of the interposer. The interposer can be electrically coupled to the substrate 410 by wire bonding or any other suitable technology/process.

With continued reference to FIG. 3, the package body 440 is disposed on the carrier surface 412 and covers the first device 422 and the second device 432. In addition, the package body 440 includes, or is formed with, a set of first openings 442 and a set of second openings 444 exposing the first connecting elements 424 and the second connecting elements 434. In the illustrated embodiment, top ends 425 of the first connecting elements 424 and top ends 435 of the second connecting elements 434 are recessed below a top surface 445 of the package body 440. In alternative embodiments the top ends 425, 435 also can be substantially aligned or coplanar with the top surface 445 or can protrude above the top surface 445.

As shown in FIG. 3, the substrate 410 further includes a bottom surface 418 opposite the carrier surface 412. A set of third pads 419 is disposed on the bottom surface 418. A third connecting element 460 may be disposed on each of the third pads 419 to allow the package 400 to be connected to an external circuit, such as a printed circuit board (not shown).

Figure 4:
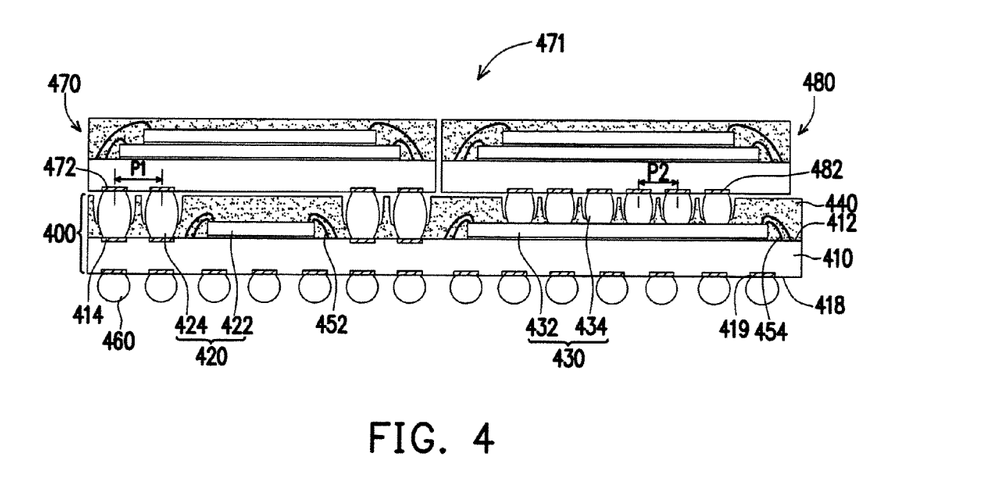
FIG. 4 is a cross-sectional front elevation view of a PoP assembly including the package of FIG. 3.

FIG. 4 illustrates a PoP assembly obtained from performing a PoP process on the package 400 of FIG. 3. As shown in FIG. 4, a first external device 470 and a second external device 480 are disposed over the first device 422 and the second device 432, respectively. In the illustrated embodiment, the first and second external devices 470, 480 are semiconductor device packages of a stacked chip type. In alternative embodiments, at least one of the first and second external devices 470, 480 can be, for example, a chip, such as an unpackaged chip.

The first external device 470 includes a set of pads 472 having a first pitch $P_1$. The first external device 470 is connected to the first connecting elements 424 through the pads 472 and, optionally, connecting elements disposed on the pads 472. The second external device 480 includes a set of pads 482 having a second pitch $P_2$. The second external device 480 is connected to the second connecting elements 434 through the pads 482 and, optionally, connecting elements disposed on the pads 482.

Advantageously, in the embodiment illustrated in FIGS. 3 and 4, the first external device 470 and the second external device 480, which have different lead layouts, including different pitches, can both be stacked on the package 400 in a side-by-side manner. Thus, the present packages enable enhanced compatibility with, and a better ability to accommodate, different types of external devices having different lead layouts and/or different pitches.

In one embodiment of a process for manufacturing the package structures illustrated FIGS. 3 and 4, the first pads 414 are formed on or deposited on the carrier surface 412 of the substrate 410. The first connecting elements 424 are then formed on or deposited on the first pads 414 as the first external contacts.

Thereafter, the first device 422 and the second device 432 are placed side-by-side on the carrier surface 412, and electrically coupled to the substrate 410 by wire bonding or any other interconnect technology/process. The first pads 414 are located adjacent to a periphery of the first device 422 and electrically coupled to the first device 422. The second pads 436 are then formed on or deposited on a top surface of the second device 432. The second connecting elements 434 are then formed on or deposited on the second pads 436 as the second external contacts.

In the present embodiment, the first connecting elements 424 are described as being formed prior to placing the first device 422 and the second device 432. However, in alternative embodiments the order of these steps could be reversed, or the steps could be combined.

In another step, the package body 440 is deposited on or formed on the carrier surface 412 to cover the first device 422, the second device 432, the first connecting elements 424, and the second connecting elements 434. Thereafter, the first openings 442 and the second openings 444 are formed in the package body 440. The first openings 442 expose the first connecting elements 424, and the second openings 444 expose the second connecting elements 434.

In another step, the first external device 470 is disposed over the first device 422 and coupled to the first connecting elements 424. The second external device 480 is disposed over the second device 432 and coupled to the second connecting elements 434. The resulting PoP assembly is shown in FIG. 4.

At any of various points during the foregoing process, the third connecting elements 460 are formed on or deposited on the third pads 419 on the bottom surface 418 of the substrate 410. For example, this step can be performed before or after the package body 440 is formed. If before, it can be performed before, after, or at the same time as the first and second connecting elements 424, 434 are formed on or deposited on the first and second pads 414, 436. In fact, the order of operations described with respect to any of the present embodiments should not be interpreted as limiting. Any order of operations is within the scope of the present embodiments. Various processes, such as a re-soldering process, can be performed on the third connecting elements 460.

In alternative embodiments, the lead design of the first device module 420 can be a fan-in configuration, and the lead design of the second device module 430 can be a fan-out configuration. Alternatively, at least one of the first device module 420 and the second device module 430 can be a combination of a fan-in configuration and a fan-out configuration. Further, in the illustrated embodiment one set of connecting elements 424 is adjacent to a periphery of the device 422 and another set of connecting elements 434 is disposed on a top surface of the device 432. In alternative embodiments, these configurations may be reversed, or both sets of connecting elements 424, 434 may be adjacent to a periphery of their respective devices 422, 432, or both sets of connecting elements 424, 434 may be disposed on a top surface of their respective devices 422, 432.

Figure 5:
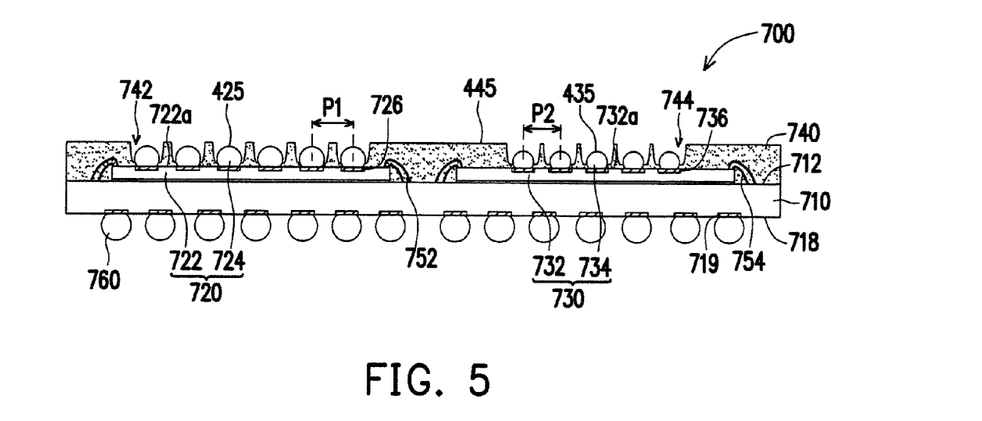
FIG. 5 is a cross-sectional front elevation view of a semiconductor device package according to another one of the present embodiments.

FIG. 5 illustrates a semiconductor device package 700 according to another one of the present embodiments. Certain aspects of the package 700 are similar to aspects of the packages 100, 400 described above with reference to FIGS. 1A and 3. For clarity, these aspects are not repeated below.

With reference to FIG. 5, the package 700 includes a substrate 710, a first device module 720, a second device module 730, and a package body 740. The lead designs of the first device module 720 and the second device module 730 are fan-in configurations, but could be any configuration.

The first device module 720 includes a first semiconductor device 722 and a set of first connecting elements 724. The first device 722 is disposed on a top surface or carrier surface 712 of the substrate 710. The first device 722 includes a set of first pads 726 in the form of an array on a top surface 722a thereof. The first connecting elements 724 are disposed on respective ones of the first pads 726. A first pitch $P_1$ separates two adjacent ones of the first pads 726, as well as two adjacent ones of the first connecting elements 724.

In the illustrated embodiment, the first device 722 is electrically coupled to the substrate 710 through a set of wires 752 by wire bonding. The first connecting elements 724 could also be electrically coupled to the substrate 710 though an RDL (not shown) on the top surface 722a of the first device 722 and additional wires (not shown). In alternative embodiments, the first device 722 may be electrically coupled to the substrate 710 by a flip-chip interconnect technology/process combined with TSV technology/process, or any other suitable technology/process. Further, an interposer (not shown) can be located on the top surface 722a of the first device 722, and the first pads 726 can be located on a top surface of the interposer.

With continued reference to FIG. 5, the second device module 730 includes a second semiconductor device 732 and a set of second connecting elements 734. The second device 732 is disposed on the carrier surface 712, and includes a set of second pads 736 in the form of an array located on a top surface 732a thereof. A set of second connecting elements 734 are disposed on the second pads 736. A second pitch $P_2$ separates two adjacent ones of the second pads 736, as well as two adjacent ones of the second connecting elements 734. The first pitch $P_1$ is greater than the second pitch $P_2$. However, in alternative embodiments the first pitch $P_1$ may be smaller than, or substantially the same as, the second pitch $P_2$.

In the embodiment of FIG. 5, the second device 732 is electrically coupled to the substrate 710 through a set of wires 754 by wire bonding. In alternative embodiments, the second device 732 may be electrically coupled to the substrate 710 by a flip-chip interconnect technology/process or any other suitable technology/process. An interposer (not shown) may be located on the top surface 732a of the second device 732, and the second pads 736 may be located on a top surface of the interposer.

The package body 740 is disposed on the carrier surface 712 and covers the first device 722 and the second device 732. The package body 740 includes, or is formed with, a set of first openings 742 and a set of second openings 744 exposing the first connecting elements 724 and the second connecting elements 734, respectively. In the illustrated embodiment, top ends 425 of the first connecting elements 724 and top ends 435 of the second connecting elements 734 are recessed below a top surface 445 of the package body 740. In alternative embodiments, the top ends 425, 435 could be substantially aligned or coplanar with the top surface 445, or could protrude above the top surface 445.

As shown in FIG. 5, the substrate 710 further includes a bottom surface 718 opposite to the carrier surface 712. A set of third pads 719 is disposed on the bottom surface 718. A third connecting element 760 may be disposed on each of the third pads 719 to allow the package 700 to be connected to an external circuit, such as a printed circuit board (not shown).

Figure 6:
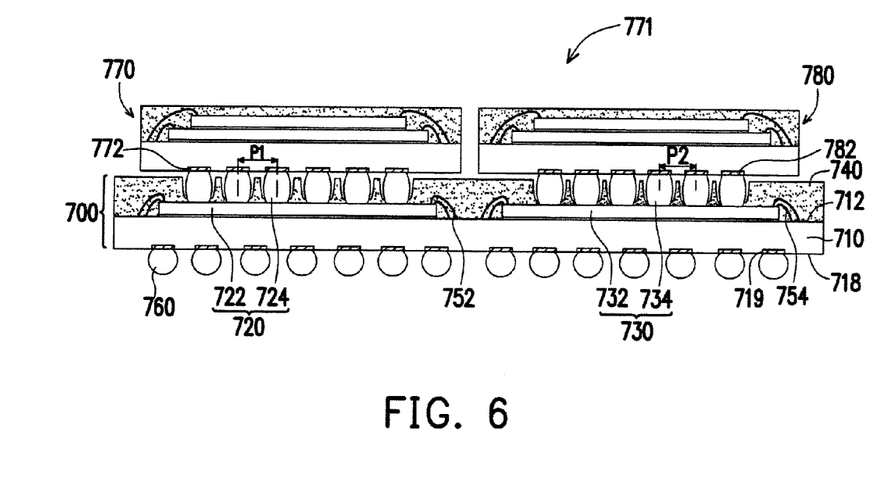
FIG. 6 is a cross-sectional front elevation view of a PoP assembly including the package of FIG. 5.

FIG. 6 illustrates a PoP assembly 771 obtained from performing a PoP process on the package 700 of FIG. 5. As shown in FIG. 6, a first external device 770 and a second external device 780 are disposed over the first device 722 and the second device 732, respectively. As illustrated, the first external device 770 and the second external device 780 may be, for example, semiconductor device packages of a stacked chip type. In alternative embodiments, at least one of the first and second external devices 770, 780 can be, for example, a chip, such as an unpackaged chip.

The first external device 770 includes a lead layout having the first pitch $P^1$, and is connected to the first connecting elements 724 through a set of pads 772. The second external device 780 includes a lead layout having the second pitch $P_2$, and is connected to the second connecting elements 734 through a set of pads 782.

Advantageously, in the embodiment illustrated in FIGS. 5 and 6, the first external device 770 and the second external device 780, which have different lead layouts, including different pitches, can both be stacked on the package 700 in a side-by-side manner. Thus, the present packages enable enhanced compatibility with, and a better ability to accommodate, different types of external devices having different lead layouts and/or different pitches.

In one embodiment of a process for manufacturing the package structures illustrated FIGS. 5 and 6, the first device 722 and the second device 732 are disposed side-by-side on the carrier surface 712 of the substrate 710. The first and second devices 722, 732 are then connected to the substrate 710 by wire bonding or any other interconnect technology/process. The first device 722 includes the first pads 726 on its top surface 722a, and the second device 732 includes the second pads 736 on its top surface 732a.

Then, the first connecting elements 724 are deposited on or formed on the first pads 726, and the second connecting elements 734 are deposited on or formed on the second pads 736. The package body 740 is then disposed on or formed on the carrier surface 712, thereby covering the first device 722, the second device 732, the first connecting elements 724, and the second connecting elements 734.

Thereafter, the first openings 742 and the second openings 744 are formed in the package body 740. The first openings 742 expose the first connecting elements 724, and the second openings 744 expose the second connecting elements 734.

The first external device 770 is subsequently disposed over the first device 722 and electrically coupled to the first connecting elements 724. In addition, the second external device 780 is disposed over the second device 732 and electrically coupled to the second connecting elements 734. The resulting PoP assembly is shown in FIG. 6.

At any of various points during the foregoing process, the third connecting elements 760 are formed on or deposited on the third pads 719 on the bottom surface 718 of the substrate 710. For example, this step can be performed before or after the package body 740 is formed. In fact, the order of operations described with respect to any of the present embodiments should not be interpreted as limiting. Any order of operations is within the scope of the present embodiments. Various processes, such as a re-soldering process, can be performed on the third connecting elements 760.

Figure 7A:
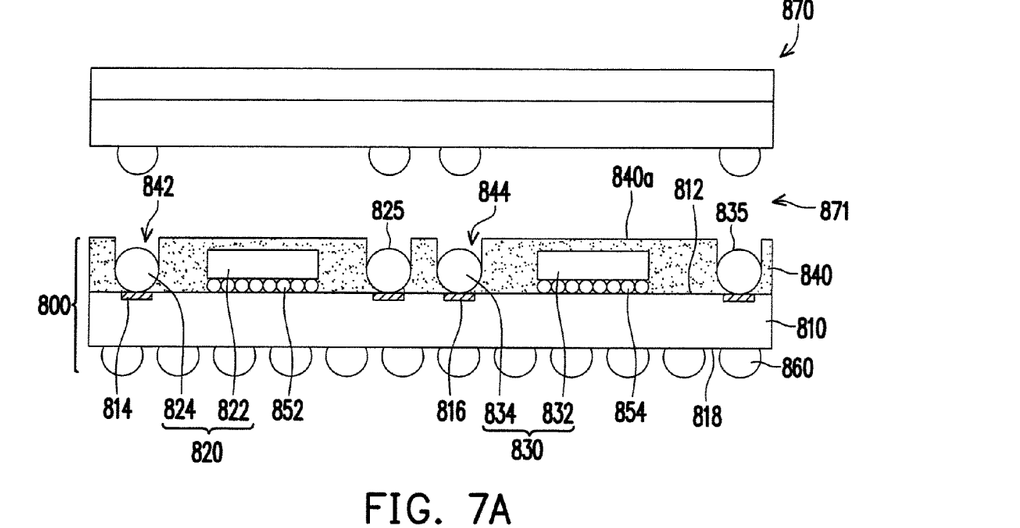
FIG. 7A is a cross-sectional front elevation view of a PoP assembly according to another one of the present embodiments.
Figure 7B:
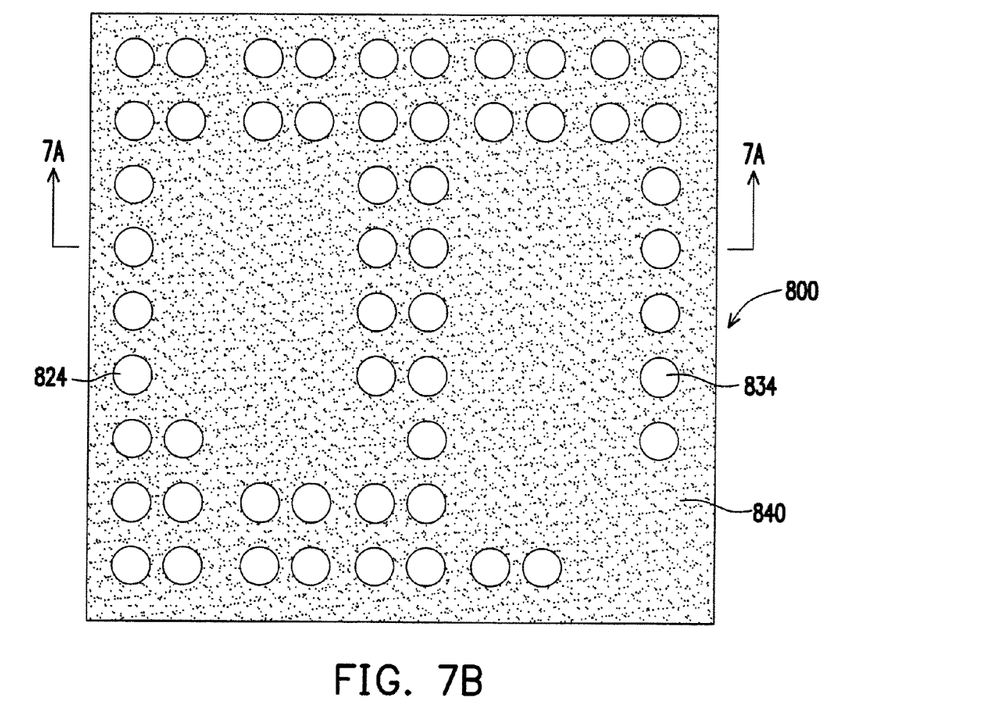
FIG. 7B is a top plan view of the PoP assembly of FIG. 7A.

FIG. 7A illustrates a PoP assembly 871 according to another one of the present embodiments. FIG. 7B illustrates a top view of a semiconductor device package 800 of the PoP assembly of FIG. 7A. Certain aspects of the assembly 871 are similar to aspects of the assemblies 171, 471, 771 described above with reference to FIGS. 1A-4. For clarity, these aspects are not repeated below.

With reference to FIGS. 7A and 7B, a semiconductor device package 800 includes a substrate 810, a first device module 820, a second device module 830, and a package body 840. In the illustrated embodiment, the lead design of the first device module 820 and the lead design of the second device module 830 are both fan-out configurations, but could be any configuration.

The first device module 820 includes a first semiconductor device 822 and a set of first connecting elements 824. The first device 822 is disposed on the carrier surface 812, and a set of first pads 814 are located adjacent to a periphery of the first device 822. The first connecting elements 824 are disposed on the first pads 814. In the illustrated embodiment, the first device 822 is electrically coupled to the substrate 810 through a set of bumps 852 by a flip-chip bonding technique, and further electrically coupled to the first pads 814 through an internal circuit (not shown) of the substrate 810.

The second device module 830 includes a second semiconductor device 832 and a set of second connecting elements 834. The second device 832 is disposed on the carrier surface 812, and a set of second pads 816 are located adjacent to a periphery of the second device 832. The second connecting elements 834 are disposed on the second pads 816. In the illustrated embodiment, the second device 832 is electrically coupled to the substrate 810 through a set of bumps 854 by a flip-chip bonding technique.

As illustrated in FIGS. 7A and 7B, a size of each first connecting element 824 is the same as a size of each second connecting element 834, and a pitch separating adjacent ones of the first connecting elements 824 is the same as a pitch separating adjacent ones of the second connecting elements 834. In other embodiments, the first connecting elements 824 and the second connecting elements 834 can be configured with different sizes and/or pitches.

With continued reference to FIG. 7A, the package body 840 is disposed on the carrier surface 812 of the substrate 810 and covers the first device 822 and the second device 832. The package body 840 includes, or is formed with, a set of first openings 842 and a set of second openings 844 exposing the first connecting elements 824 and the second connecting elements 834, respectively. In the illustrated embodiment, top ends 825 of the first connecting elements 824 and top ends 835 of the second connecting elements 834 are recessed below a top surface 840a of the package body 840. In alternative embodiments, the top ends 825, 835 may be substantially aligned or coplanar with the top surface 840a, or may protrude above the top surface 840a. Third connecting elements, such as solder balls 860, may be disposed on a bottom surface 818 of the substrate 810 to allow the package 800 to be connected to an external circuit, such as a printed circuit board (not shown), via the solder balls 860.

Referring to FIG. 7A, an external device 870 is disposed over the first device 822 and the second device 832 to form a PoP assembly 871. The external device 870 can be, for example, an assembled semiconductor device package with a single chip or stacked chips, or unpackaged chip. As in any of the present embodiments, the chip of the external device 870 could be, for example, a base-band chip. If the external device 870 is an assembled package, a substrate may support the chip. The substrate may be grounded by electrically connecting to the substrate through the first connecting elements 824 and the second connecting elements 834 to achieve a noise shielding effect between the external device 870 and the bottom package 800. This same technique may be applied to any of the present embodiments.

Referring to FIG. 7B, the first connecting elements 824 and the second connecting elements 834 can be located wherever necessary based upon design needs. The first and second connecting elements 824, 834 may fully surround their respective device, or gaps may be disposed between connecting elements. At least some of the first and second connecting elements 824, 834 may connect to a ground circuit (not shown) of the substrate 810 to achieve internal shielding for the first and second devices 822, 832.

Figure 8A:
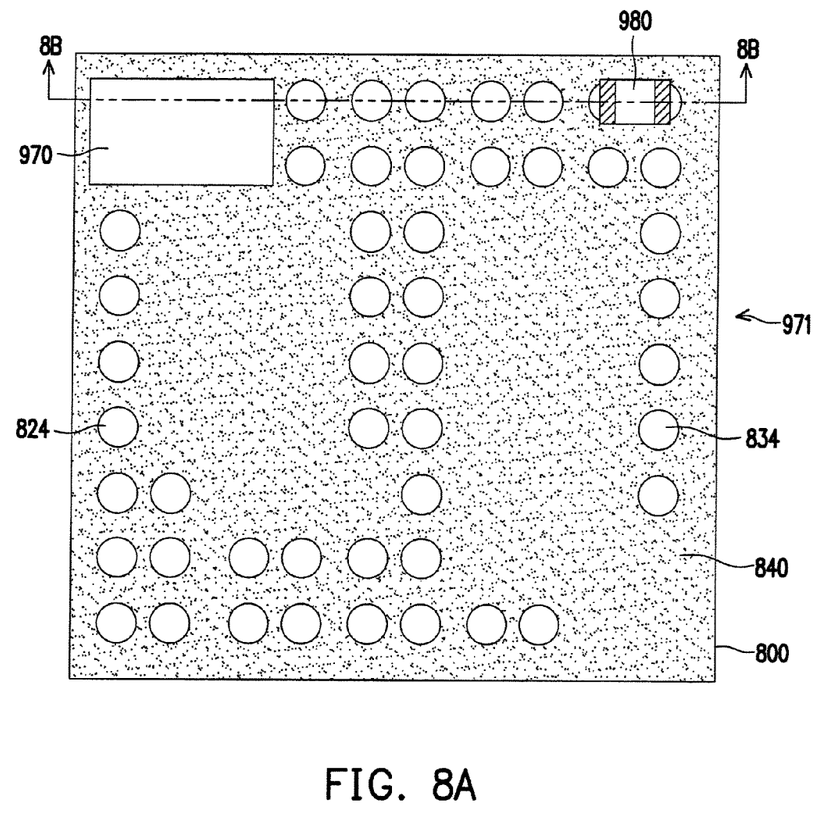
FIG. 8A is a top plan view of a PoP assembly according to another one of the present embodiments.
Figure 8B:
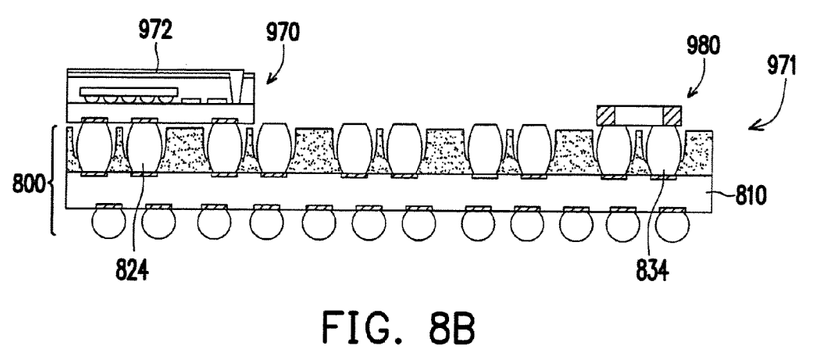
FIG. 8B is a cross-sectional front elevation view of the PoP assembly of FIG. 8A.

External devices having different lead layouts and different functions can be stacked on the package 800 of FIG. 7B in a side-by-side manner. For example, FIG. 8A is a top view of a PoP assembly 971 obtained from performing a PoP process on the package 800 of FIG. 7B according to another one of the present embodiments. FIG. 8B is a cross-sectional view taken along the line 8B-8B in FIG. 8A.

The PoP structure 971 of FIG. 8A is similar to that of FIG. 7A, except that a stacked type semiconductor device 970 integrating an antenna structure 972 and a passive component 980 are bonded to the package 800 and respectively disposed over the first device 822 and the second device 832 (FIG. 7A). The stacked type semiconductor device 970 and the passive component 980 are arranged side-by-side and electrically coupled to the substrate 810 through the first connecting elements 824 and the second connecting elements 834.

Advantageously, in the embodiments illustrated in FIGS. 7A-8B, the first external device 822 and the second external device 832, which have different lead layouts, including different pitches, can both be stacked on the package 800 in a side-by-side manner. Thus, the present packages enable enhanced compatibility with, and a better ability to accommodate, different types of external devices having different lead layouts and/or different pitches.

Although the aforementioned embodiments are discussed, by way of example, in terms of integrating two device modules with different lead layouts, the number and the types of device modules to be integrated into a package structure can be varied according to particular design criteria.

The foregoing package structures and package processes allow the integration into a single assembly of a plurality of devices with different lead dimensions, which may include different pitches. The devices may be arranged both as side-by-side chip arrangement and vertical stacking. Hence, the lower level package can be compatible with and can accommodate stacking of with various mechanical outlines corresponding to, for example, one or more JEDEC standards.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
   a substrate including a top surface;
   a first die coupled to the top surface of the substrate;
   a second die coupled to the top surface of the substrate;
   a plurality of first connecting elements coupled to the top surface of the substrate;
   a plurality of second connecting elements;
   a package body covering the first die and the second die;
   a plurality of first openings in the package body, the first openings exposing the first connecting elements; and
   a plurality of second openings in the package body, the second openings exposing the second connecting elements;
   wherein the first connecting elements are spaced by a first pitch $P_1$, the second connecting elements are spaced by a second pitch $P_2$, and the first pitch $P_1$ is not equal to the second pitch $P_2$.

2. The semiconductor device package of claim 1, wherein at least a subset of the first connecting elements or the second connecting elements are disposed between the first die and the second die.

3. The semiconductor device package of claim 1, wherein at least one of the first connecting elements has a width $W_{C1}$, and at least one of the first openings has a width $W_{U1}$ adjacent to a top surface of the package body, such that $P_1 \geq W_{U1} > W_{C1}$.

4. The semiconductor device package of claim 1, wherein a top end of at least one of the first connecting elements is below a top surface of the package body.

5. The semiconductor device package of claim 1, wherein the semiconductor device package is a first semiconductor device package, and further comprising:
   a second semiconductor device package disposed on the first semiconductor device package; and
   a plurality of stacking elements extending through respective ones of the first openings in the package body, and electrically coupling the first semiconductor device package and the second semiconductor device package.

6. The semiconductor device package of claim 5, wherein the second semiconductor device package has an antenna function.

7. The semiconductor device package of claim 6, further comprising a passive component disposed on the first semiconductor device package and adjacent to the second semiconductor device package.

8. A semiconductor device package, comprising:
   a substrate including a top surface;
   a die coupled to the top surface of the substrate;
   a plurality of first connecting elements coupled to the top surface of the substrate;
   a plurality of second connecting elements coupled to the top surface of the substrate;
   a package body covering the die;
   a plurality of first openings in the package body, the first openings exposing the first connecting elements; and
   a plurality of second openings in the package body, the second openings exposing the second connecting elements;
   wherein the first connecting elements are spaced by a first pitch $P_1$, the second connecting elements are spaced by a second pitch $P_2$, and the first pitch $P_1$ is not equal to the second pitch $P_2$.

9. The semiconductor device package of claim 8, wherein at least one of the first connecting elements has a width $W_{C1}$, and at least one of the first openings has a width $W_{U1}$ adjacent to a top surface of the package body, such that $P_1 \geq W_{U1} > W_{C1}$.

10. The semiconductor device package of claim 8, wherein a top end of at least one of the first connecting elements is below a top surface of the package body.

11. The semiconductor device package of claim 8, wherein the semiconductor device package is a first semiconductor device package, and further comprising:
    a second semiconductor device package disposed on the first semiconductor device package; and
    a plurality of stacking elements extending through respective ones of the first openings in the package body, and electrically coupling the first semiconductor device package and the second semiconductor device package.

12. The semiconductor device package of claim 11, wherein the second semiconductor device package has an antenna function.

13. The semiconductor device package of claim 12, further comprising a passive component disposed on the first semiconductor device package and adjacent to the second semiconductor device package.

14. The semiconductor device package of claim 8, further comprising a plurality of third connecting elements coupled to a bottom surface of the substrate.

15. A semiconductor device package, comprising:
    a substrate;
    a first die coupled to the substrate;
    a second die coupled to the substrate;
    a plurality of first connecting elements coupled to the substrate about the first die;
    a plurality of second connecting elements coupled to the substrate about the second die;
    a package body covering the first die and the second die;
    a plurality of first openings in the package body, the first openings exposing the first connecting elements; and
    a plurality of second openings in the package body, the second openings exposing the second connecting elements;

wherein the first connecting elements are spaced by a first pitch $P_1$, the second connecting elements are spaced by a second pitch $P_2$, and the first pitch $P_1$ is not equal to the second pitch $P_2$.

16. The semiconductor device package of claim 15, wherein at least a subset of the first connecting elements or the second connecting elements are disposed between the first die and the second die.

17. The semiconductor device package of claim 15, wherein a top end of at least one of the first connecting elements is below a top surface of the package body.

18. The semiconductor device package of claim 15, wherein the semiconductor device package is a first semiconductor device package, and further comprising:
   a second semiconductor device package disposed on the first semiconductor device package; and
   a plurality of stacking elements extending through respective ones of the first openings in the package body, and electrically coupling the first semiconductor device package and the second semiconductor device package.

19. The semiconductor device package of claim 18, wherein the second semiconductor device package has an antenna function.

\* \* \* \* \*